US012764965B2

(12) United States Patent
Luo et al.

(10) Patent No.: US 12,764,965 B2
(45) Date of Patent: Oct. 13, 2026

(54) SEMICONDUCTOR DEVICE BASED ON DIELECTRIC MATERIAL CONTAINING METAL INTERSTITIAL IMPURITY

(71) Applicant: INSTITUTE OF MICROELECTRONICS, CHINESE ACADEMY OF SCIENCES, Beijing (CN)

(72) Inventors: Qing Luo, Beijing (CN); Yuan Wang, Beijing (CN); Ming Liu, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 440 days.

(21) Appl. No.: 18/397,387

(22) Filed: Dec. 27, 2023

(65) Prior Publication Data

US 2025/0031379 A1 Jan. 23, 2025

(30) Foreign Application Priority Data

Jul. 18, 2023 (CN) ........................ 202310886393.X

(51) Int. Cl.

*H10B 51/30* (2023.01)
*H10B 53/30* (2023.01)
*H10D 30/69* (2025.01)
*H10D 64/01* (2025.01)
*H10D 64/68* (2025.01)

(52) U.S. Cl.

CPC ............ *H10B 51/30* (2023.02); *H10B 53/30* (2023.02); *H10D 30/701* (2025.01); *H10D 64/033* (2025.01); *H10D 64/689* (2025.01)

(58) Field of Classification Search

CPC ...... H10B 51/30; H10B 53/30; H10D 30/701; H10D 64/033; H10D 64/689; H10D 64/693; H10N 70/041; H10N 70/231; H10N 70/826; H10N 70/8833; H10N 70/8836; H10N 70/235; H10W 74/40

USPC .......................................................... 257/295

See application file for complete search history.

(56) References Cited

U.S. PATENT DOCUMENTS

| | | | | |
|---|---|---|---|---|
| 7,709,359 | B2 * | 5/2010 | Boescke | H10D 64/033<br>438/785 |
| 8,759,806 | B2 * | 6/2014 | Yamaguchi | H10N 70/24<br>257/43 |
| 9,209,394 | B2 * | 12/2015 | Ode | H10N 70/801 |
| 11,362,276 | B2 * | 6/2022 | Cheng | G11C 13/0004 |
| 2024/0032307 | A1 * | 1/2024 | Müller | H10B 53/30 |

* cited by examiner

*Primary Examiner* — Vu A Vu

(74) *Attorney, Agent, or Firm* — Christopher R. Christenson; Kelly, Holt & Christenson, P.L.L.C.

(57) ABSTRACT

The present disclosure provides a semiconductor device based on a dielectric material containing a metal interstitial impurity, including: a substrate, a dielectric material layer, and a functional layer. A material for preparing the dielectric material layer is a compound containing the metal interstitial impurity. The dielectric material layer and/or the functional layer is configured to subject to at least one of electricity, heat, light or magnetism, such that the dielectric material layer reaches a crystallization temperature to transit from a first state to a second state.

11 Claims, 6 Drawing Sheets

SEMICONDUCTOR DEVICE BASED ON DIELECTRIC MATERIAL CONTAINING METAL INTERSTITIAL IMPURITY

CROSS REFERENCE TO RELATED APPLICATION

This application claims priority to Chinese Patent Application No. 202310886393.X, filed on Jul. 18, 2023, the entire content of which is incorporated herein in its entirety by reference.

TECHNICAL FIELD

The present disclosure relates to a field of microelectronics and dielectric material technology, and in particular, to a semiconductor device based on a dielectric material containing a metal interstitial impurity.

BACKGROUND

With the developments of information technology, demands for information storage is constantly increasing, and higher requirements are being put forward for the capacity, volume, power consumption, and price of a memory. The integrated circuit industry aims to achieve increasing a capacity of the memory by reducing the minimum feature size of a device. This translates to miniaturization of electronic entities, for example, miniaturization of transistors, capacitors, resistors, and/or signal lines. Various electronic entities involve a dielectric layer. For example, a transistor includes a gate electrode which is separated from a channel of the transistor by a dielectric layer. For another example, a capacitor includes a dielectric layer arranged between two opposite electrodes. Usually, maximizing the dielectric constant of the dielectric layer may reduce features and/or areas of electrodes, which may increase the capacity of the memory. Furthermore, maximizing the dielectric constant of the dielectric layer may further reduce a leakage current through the dielectric layer.

A high k material is a dielectric material with a high dielectric constant, which has been widely studied in industry and academia. Such material is defined as a dielectric material with a dielectric constant greater than that of silicon dioxide. Examples of the high k material include transition metal oxides, zirconia, hafnium oxide, lead zirconium titanate, tantalum oxide, silicon nitride, and/or barium strontium titanate. A flash memory device, as a typical memory device using the high k material to increase the capacity of the memory, hits a bottleneck in its development. On the one hand, a constant reduction in a device size leads to higher manufacturing costs. On the other hand, a series of reliability problems caused by the size reduction make the flash memory device difficult to be developed along the Moore's Law. Therefore, there is urgent demand for researching and developing a new type of non-volatile memory with high density and low power consumption. A ferroelectric memory has advantages such as high speed, low power consumption, simple structure and easy integration. It has been discovered that an $HfO_2$-doped high k material exhibits ferroelectricity in recent years of research, which makes the ferroelectric memory one of the popular candidates for the new non-volatile memory in the post Moore era. However, the existing $HfO_2$-doped ferroelectric thin film still suffers from reliability problems such as an operating voltage approaching a breakdown voltage and fatigue.

SUMMARY

The present disclosure provides a semiconductor device based on a dielectric material containing a metal interstitial impurity, including: a substrate, a dielectric material layer, and a functional layer, where a material for preparing the dielectric material layer is a compound containing the metal interstitial impurity; and the dielectric material layer and/or the functional layer is configured to subject to at least one of electricity, heat, light or magnetism, such that the dielectric material layer reaches a crystallization temperature to transit from a first state to a second state.

According to an embodiment of the present disclosure, a chemical formula of the compound containing the metal interstitial impurity is: $X_aY_{1-a}Z_bW$, where X is a first element, Y is a doped impurity element, Z is an interstitial impurity element, W is a second element, a is a content of the first element, (1−a) is a content of the doped impurity element, where $0 \le a \le 1$; and b is a content of the interstitial impurity element, where $0.05 \le b \le 0.5$.

According to an embodiment of the present disclosure, the first element is selected from transition metal element, hafnium, zirconium, silicon, aluminum, titanium, tantalum, barium, strontium, lanthanum, yttrium, erbium, calcium, magnesium, and rare-earth element; the second element is selected from nitrogen, oxygen, and titanium acid; the doped impurity element is selected from one or more of transition metal element, hafnium, zirconium, silicon, aluminum, titanium, tantalum, barium, strontium, lanthanum, yttrium, erbium, calcium, magnesium, and rare-earth element; the interstitial impurity element is selected from one or more of transition metal element, hafnium, zirconium, silicon, aluminum, titanium, tantalum, barium, strontium, lanthanum, yttrium, erbium, calcium, magnesium, and rare-earth element; and the metal interstitial impurity is in a lattice interstice of the dielectric material in a crystalline state.

According to an embodiment of the present disclosure, the dielectric material layer includes a hafnium zirconium oxide compound, the first element and/or the doped impurity element and/or the interstitial impurity element are selected from hafnium and zirconium, and the second element is oxygen.

According to an embodiment of the present disclosure, the first state includes an amorphous state, and the second state includes a crystalline state; the crystalline state includes a monoclinic crystal state, a tetragonal crystal state, a rhombohedral crystal state, an orthorhombic crystal state, or a cubic crystal state, where the dielectric material layer in the crystalline state contains the metal interstitial impurity in a lattice interstice.

According to an embodiment of the present disclosure, the metal interstitial impurity in the lattice interstice of the dielectric material layer in the crystalline state causes lattice expansion and lattice deformation, so as to generate a tensile stress and/or a compressive stress, and the dielectric material layer has a ferroelectric domain.

According to an embodiment of the present disclosure, the first state includes a first crystalline state, and the second state includes a second crystalline state.

According to an embodiment of the present disclosure, the first crystalline state and/or the second crystalline state includes a region or a domain in a monoclinic crystal state, a tetragonal crystal state, a rhombohedral crystal state, an orthorhombic crystal state, or a cubic crystal state.

According to an embodiment of the present disclosure, when the dielectric material layer is in a ferroelectric polarization state as a whole or in part, a polarization orientation of the dielectric material layer points towards an interface between the dielectric material layer and the functional layer or an interface between the dielectric material layer and the substrate, and the polarization orientation is reversed by using at least one of electricity, heat, light, force or magnetism, such that the dielectric material layer is switched between different ferroelectric states.

According to an embodiment of the present disclosure, the dielectric material layer further includes an antiferroelectric state, and when the dielectric material layer is in the antiferroelectric state as a whole or in part, adjacent dipole moments in the dielectric material layer are oriented opposite to each other, such that an overall polarization of the dielectric material layer tends to disappear.

According to an embodiment of the present disclosure, the functional layer includes an electrode and a channel layer, so as to achieve a function of a device including at least one of a transistor, a capacitor, a resistor, a conductor laser, or an optical sensor.

DETAILED DESCRIPTION OF EMBODIMENTS

The present disclosure provides a semiconductor device based on a dielectric material containing a metal interstitial impurity. A bottom electrode layer is formed on a substrate. An amorphous dielectric material layer is formed on the bottom electrode layer, where the dielectric material layer needs to be doped and has a crystallization temperature. An upper electrode layer is formed on the dielectric material layer at a temperature lower than the crystallization temperature. Finally, the dielectric material layer is heated to a temperature greater than or equal to the crystallization temperature to complete an annealing. A crystal containing a large amount of metal interstitial impurity is formed in the dielectric material layer, where the dielectric material layer has a ferroelectric property and forms as a ferroelectric thin film. The interstitial impurity in the thin film may reduce energy of a ferroelectric polarization reversal and reduce a coercive electric field of the device. The ferroelectric thin film made of the dielectric material containing the metal interstitial impurity proposed in the present disclosure may be applied to a ferroelectric capacitor, a ferroelectric transistor, etc.

In order to make the objectives, technical solutions, and advantages of the present disclosure clearer, the present disclosure will be further described in detail below combined with specific embodiments and with reference to the accompanying drawings.

Figure 1A:
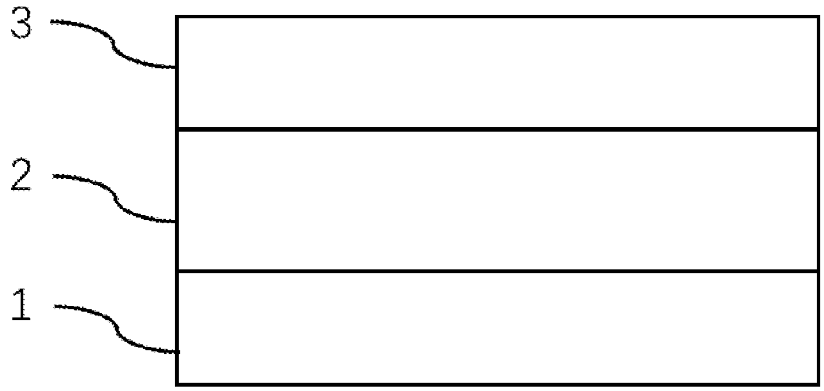
FIG. 1A shows a schematic diagram of a composition of a semiconductor device based on a dielectric material containing a metal interstitial impurity according to an embodiment of the present disclosure.

FIG. 1A shows a schematic diagram of a composition of a semiconductor device based on a dielectric material containing a metal interstitial impurity according to an embodiment of the present disclosure. In the embodiments of the present disclosure, a semiconductor device based on a dielectric material containing a metal interstitial impurity is provided. As shown in FIG. 1A, the semiconductor device based on the dielectric material containing the metal interstitial impurity includes: a substrate 1, a dielectric material layer 2, and a functional layer 3.

A material for preparing the dielectric material layer 2 is a compound containing the metal interstitial impurity.

The dielectric material layer 2 and/or the functional layer 3 is configured to subject to at least one of electricity, heat, light or magnetism, such that the dielectric material layer 2 reaches a crystallization temperature to transit from a first state to a second state.

According to the embodiments of the present disclosure, a chemical formula of the compound containing the metal interstitial impurity is $X_aY_{1-a}Z_b$ W, where X is a first element, Y is a doped impurity element, Z is an interstitial impurity element, W is a second element, a is a content of the first element, (1−a) is a content of the doped impurity element, where $0 \leq a \leq 1$, and b is a content of the interstitial impurity element, where $0.05 \leq b \leq 0.5$.

According to the embodiments of the present disclosure, the first element is selected from transition metal element, hafnium, zirconium, silicon, aluminum, titanium, tantalum, barium, strontium, lanthanum, yttrium, erbium, calcium, magnesium, and rare-earth element. The second element is selected from nitrogen, oxygen, and titanium acid. The doped impurity element is selected from one or more of transition metal element, hafnium, zirconium, silicon, aluminum, titanium, tantalum, barium, strontium, lanthanum, yttrium, erbium, calcium, magnesium, and rare-earth element. The interstitial impurity element is selected from transition metal element, hafnium, zirconium, silicon, aluminum, titanium, tantalum, barium, strontium, lanthanum, yttrium, erbium, calcium, magnesium, and rare-earth element. The metal interstitial impurity is located in lattice interstices of the dielectric material in the crystalline state. Preferably, the dielectric material layer includes a hafnium zirconium oxide compound, the first element and/or the doped impurity element and/or the interstitial impurity element are selected from hafnium and zirconium, and the second element is oxygen.

In the embodiments of the present disclosure, FIG. 1A schematically shows a position and a structure of the functional layer 3, which is disposed on the dielectric material layer 2. It will be noted that the functional layer 3 may also include a plurality of different functional sub-layers, which may be separately disposed at different positions according to actual needs of the semiconductor device, for example, they may be disposed above and/or below the dielectric material layer 2.

Figure 1B:
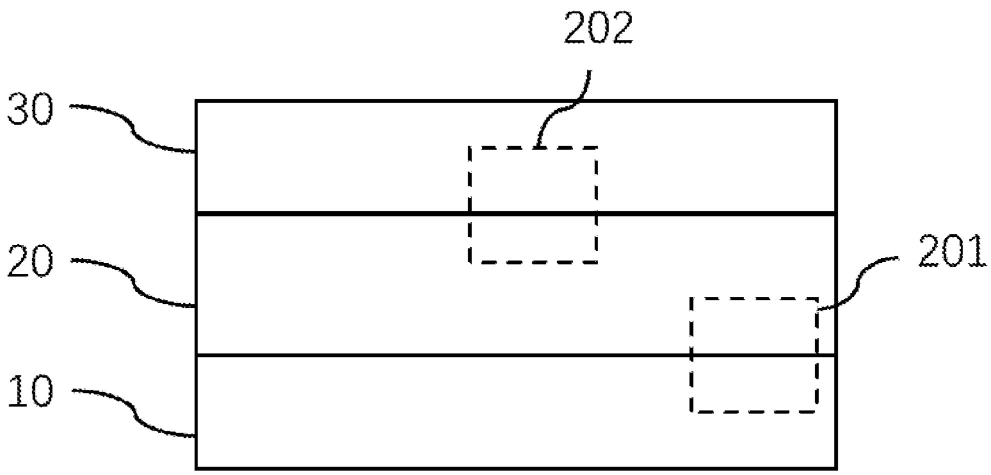
FIG. 1B shows a schematic diagram of a basic structure of a semiconductor device based on a dielectric material containing a metal interstitial impurity according to an embodiment of the present disclosure.

In the embodiments of the present disclosure, FIG. 1B shows a schematic diagram of a basic structure of a semiconductor device based on a dielectric material containing a metal interstitial impurity according to an embodiment of the present disclosure. As shown in FIG. 1B, the dielectric material layer 20 is disposed on a substrate 10, where the substrate 10 may include a semiconductor substrate, a semiconductor substrate with an electronic entity, an electrode, or a substrate with an electrode region or electrode layer. The electronic entity may include a transistor, a capacitor, a resistor, a diode, a conductor, and an insulator. A cover layer 30 is disposed on the dielectric material layer 20, where the cover layer 30 may include a conductive region, an electrode region, or an electrode layer. The cover layer 30 may include an electrode, such as a top electrode. The electrode includes titanium nitride, tantalum nitride, tungsten nitride, niobium nitride, ruthenium oxide, tungsten, platinum, carbon, iridium, and/or ruthenium, or a mixture of the above. A thickness of the electrode may be in a range of 5 nm to 100 nm.

The dielectric material layer 20 may include a transition metal oxide, zirconia, hafnium oxide, lead zirconate titanate, tantalum oxide, silicon nitride, and/or barium strontium titanate. In addition, the dielectric material layer 20 may include the above doped oxides, where a dopant may include silicon, hafnium, zirconium, aluminum, titanium, lanthanum, yttrium, erbium, rare-earth elements, calcium, magnesium, and/or strontium. The substrate is a further electrode, such as a bottom electrode, which may include titanium nitride, tantalum nitride, tungsten nitride, niobium nitride, ruthenium oxide, tungsten, platinum, carbon, iridium, silicon, and/or ruthenium. A thickness of the further electrode may be in a range of 5 nm to 100 nm.

The dielectric material layer 20 may include a region or a domain of a monoclinic system, a tetragonal system, a rhombohedral system, an orthorhombic system, or a cubic crystal system containing a large amount of interstitial impurity. In addition, the entire dielectric material layer 20 may be in a tetragonal crystal state, an orthorhombic crystal state, or a rhombohedral crystal state. The interstitial impurity in a lattice may cause the lattice to expand, generating significant tensile and compressive stresses, and such stresses may stabilize in a corresponding crystalline state. Under a given composition, temperature, and/or pressure, the crystalline state will not exist if there is no stress. The crystal orientation may be defined relative to an interface between the dielectric material layer 20 and the substrate, the electrode, or the cover layer (for example, an interface between the dielectric material layer 20 and the substrate 10 or the cover layer 30). Such interface may be in regions 201 and 202. The crystalline state will be described in combination with FIG. 3.

According to the embodiments of the present disclosure, the first state includes an amorphous state, and the second state includes a crystalline state. The crystalline state includes a monoclinic crystal state, a tetragonal crystal state, a rhombohedral crystal state, an orthorhombic crystal state, or a cubic crystal state, where there is the metal interstitial impurity in the lattice interstices of the dielectric material layer in the crystalline state.

According to the embodiments of the present disclosure, the impurity in the lattice interstices of the dielectric material layer in the crystalline state may cause a lattice expansion and a lattice deformation, so as to generate a tensile stress and/or a compressive stress, and the dielectric material layer has a ferroelectric domain.

According to the embodiments of the present disclosure, the first state includes a first crystalline state, and the second state includes a second crystalline state. The first crystalline state and/or the second crystalline state includes a region or a domain in the monoclinic crystal state, the tetragonal crystal state, the rhombohedral crystal state, the orthorhombic crystal state, or the cubic crystal state.

When the dielectric material layer is in a ferroelectric polarization state as a whole or in part, a polarization orientation of the dielectric material layer points towards an interface between the dielectric material layer and the functional layer or an interface between the dielectric material layer and the substrate, and the polarization orientation may be reversed by using at least one of electricity, heat, light, force or magnetism, so that the state of the dielectric material layer is switched between different ferroelectric states.

The cover layer 30 may promote a transition of a structural state of the dielectric material layer 20, for example, a transition from an amorphous state to a crystalline state, or a transition from one crystalline state to another crystalline state. The crystalline state includes the monoclinic crystal state, the tetragonal crystal state, the rhombohedral crystal state, the orthorhombic crystal state, or the cubic crystal state.

According to the embodiments of the present disclosure, the functional layer may include functional structural layers such as an electrode and a channel layer, so as to achieve a function of a device including at least one of a transistor, a capacitor, a resistor, a conductor laser, or an optical sensor.

Figure 2A:
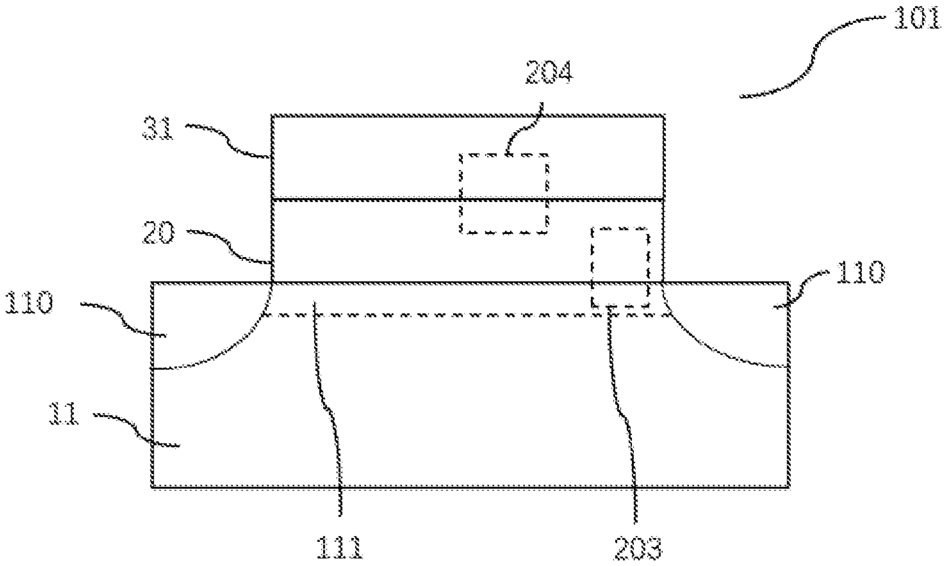
FIG. 2A shows a schematic diagram of a basic structure of a transistor based on a dielectric material containing a metal interstitial impurity according to an embodiment of the present disclosure.

In the embodiments of the present disclosure, FIG. 2A shows a schematic diagram of a basic structure of a transistor based on a dielectric material containing a metal interstitial impurity according to an embodiment of the present disclosure. A transistor 101 is disposed on a substrate 11. The substrate 11 includes a doped region 110, such as a source region and/or a drain region. A transistor channel 111 is provided in the substrate 11 and between the doped regions 110. The dielectric material layer 20 is disposed on a surface of the substrate 11 and separates an electrode 31 (such as a gate electrode) from the transistor channel 111. Regions 203 and 204 are respectively provided at an interface between the dielectric material layer 20 and the substrate 11 as well as an interface between the dielectric material layer 20 and a cover layer 31. The conductivity of the transistor channel 111 may be enhanced and/or depleted by applying a voltage at the electrode 31.

An entity of the transistor 101 may be a selection transistor of a memory device, such as a dynamic random-access memory (DRAM). In addition, the entity of the transistor 101 may be a transistor of a logic circuit, or a transistor of a logic entity of a microprocessor or a memory device.

Figure 2B:
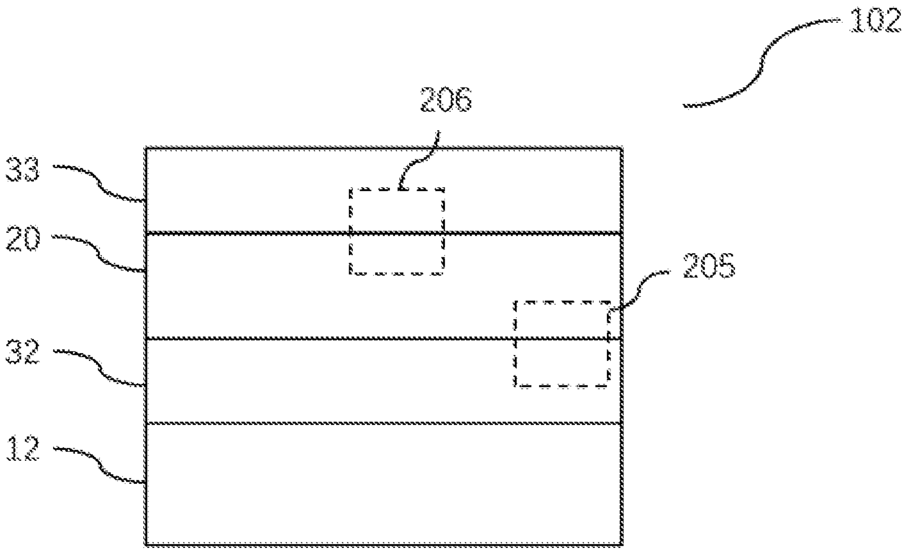
FIG. 2B shows a schematic diagram of a structure of a capacitor based on a dielectric material containing a metal interstitial impurity according to an embodiment of the present disclosure.

In the embodiments of the present disclosure, FIG. 2B shows a schematic diagram of a structure of a capacitor based on a dielectric material containing a metal interstitial impurity according to an embodiment of the present disclosure. A capacitor 102 is disposed on, in and/or near a substrate 12. The dielectric material layer 20 is disposed between a first electrode 32 and a second electrode 33, where the first electrode 32 may be a bottom electrode, and the second electrode 33 may be a top electrode. The dielectric material layer 20 may have a region or a domain in one of the aforementioned crystalline states, such as regions 205 and 206, which may provide an enhanced dielectric constant and generate the ferroelectric property, so as to increase a capacity of the capacitor 102, thereby enabling the device to have a non-volatile storage function and permitting miniaturization of an area of at least one the first electrode 32 and the second electrode 33. The dielectric material layer 20 may be part of any type of capacitor. Such capacitor includes an integrated capacitor such as a trench capacitor, a stacked capacitor or a planar capacitor, as well as a discrete capacitor.

Figure 3A:
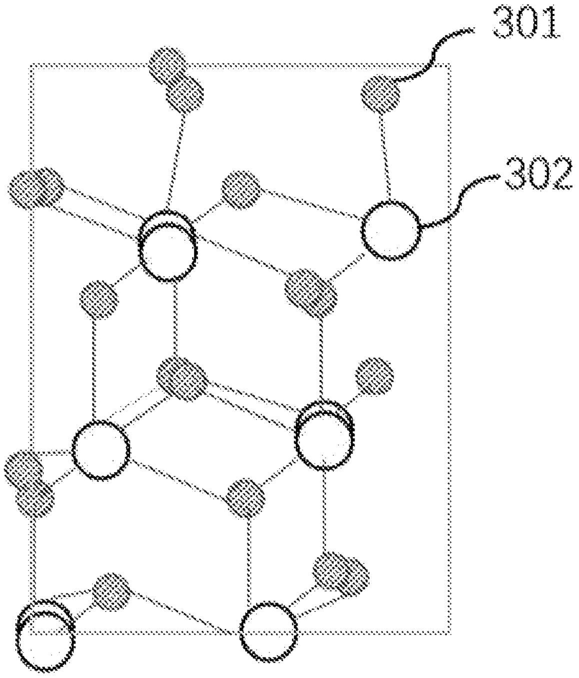
FIG. 3A shows a schematic diagram of a microstructure of a dielectric material in a rhombohedral crystal state with a standard chemical ratio according to an embodiment of the present disclosure.

In the embodiments of the present disclosure, FIG. 3A shows a schematic diagram of a microstructure of a dielectric material (such as $HfO_2$) in a rhombohedral crystal state with a standard chemical ratio according to the embodiments of the present disclosure. As shown in FIG. 3A, a compound material includes a first element 301 and a second element 302. The first element 301 and the second element 302 may be one of transition metal element, zirconium, hafnium, tantalum, barium, strontium, silicon, aluminum, titanium, lanthanum, yttrium, erbium, calcium, magnesium, rare-earth element, nitrogen, and/or oxygen. An example of the compound material may include hafnium oxide or zirconia. In addition, the compound material may include a dopant, such as silicon, hafnium, zirconium, aluminum, lanthanum, yttrium, erbium, magnesium, a rare-earth element, calcium, and/or strontium. The first element may include oxygen, and the second element 302 may include one of transition metal, zirconium, hafnium, tantalum, barium, strontium, silicon, aluminum, titanium, lanthanum, yttrium, erbium, calcium, magnesium, rare-earth element, nitrogen, and/or oxygen.

Figure 3B:
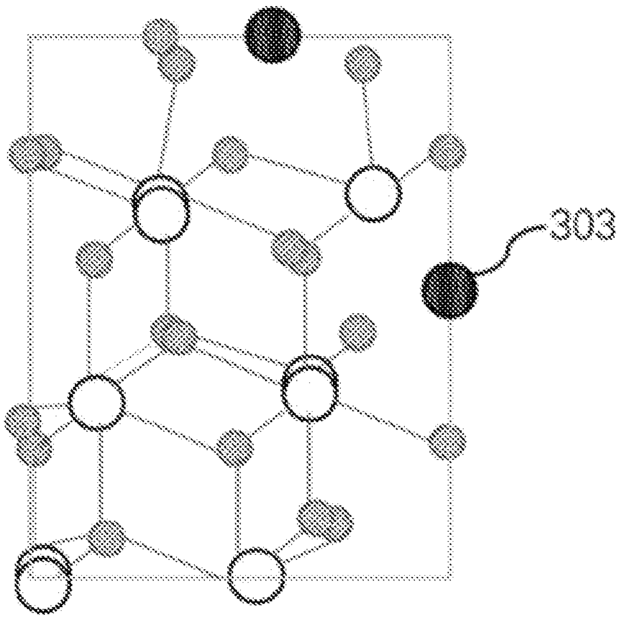
FIG. 3B shows a schematic diagram of a microstructure of a dielectric material in a rhombohedral crystal state containing a metal interstitial impurity according to an embodiment of the present disclosure.

In the embodiments of the present disclosure, FIG. 3B shows a schematic diagram of a microstructure of a dielectric material in a rhombohedral crystal state containing a metal interstitial impurity according to an embodiment of the present disclosure. Compared with the structure shown in FIG. 3A, the compound material of the structure shown in FIG. 3B has a large amount of the interstitial impurity 303. The interstitial impurity 303 may be at least one of transition metal element, zirconium, hafnium, tantalum, barium, strontium, silicon, aluminum, titanium, lanthanum, yttrium, erbium, calcium, magnesium, and rare-earth element, and a content of the interstitial impurity may range from 0.05 to 0.5, such as 0.125.

Figure 4A:
FIGS. 4A to 4D show schematic diagrams of basic structures of a semiconductor device based on a dielectric material containing a metal interstitial impurity in various preparation stages according to an embodiment of the present disclosure.

In the embodiments of the present disclosure, FIGS. 4A to 4D show schematic diagrams of basic structures of a semiconductor device based on a dielectric material containing a metal interstitial impurity in various preparation stages according to an embodiment of the present disclosure. Referring to FIG. 4A, the substrate 10 is provided. The substrate 10 may include a semiconductor substrate, and may further include electronic entities or optical entities. These entities include transistor elements, capacitor elements, resistor elements, diode elements, light-emitting elements, semiconductor laser elements, optical sensor elements, or electronic or optical entities formed of other known integrated circuits. In addition, the substrate 10 may include an electrode, where the electrode may include titanium nitride, tantalum nitride, tungsten nitride, niobium nitride, ruthenium oxide, tungsten, platinum, carbon, iridium, and/or ruthenium, and a thickness of the electrode may be in a range of 5 nm to 100 nm. The dielectric material layer 20 may be disposed on the electrode.

Figure 4B:
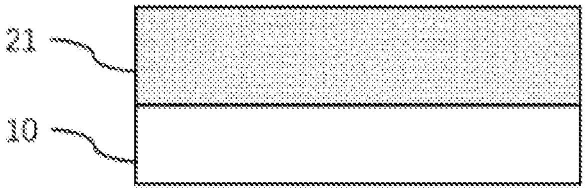

In another process, as shown in FIG. 4B, a primary dielectric material layer 21 is provided on the substrate 10. The primary dielectric material layer 21 may be provided by using one of an atomic layer deposition (ALD) process, a metal organic atomic layer deposition (MOALD) process, a chemical vapor deposition (CVD) process, a metal organic chemical vapor deposition (MOCVD) process, a physical vapor deposition (PVD) process, or the like. The primary dielectric material layer 21 may include a transition metal oxide, zirconia, hafnium oxide, titanium oxide, and silicon nitride. In addition, the primary dielectric material layer 21 may include at least one dopant, which may be selected from a combination of silicon, aluminum, lanthanum, yttrium, erbium, calcium, magnesium, strontium, and/or rare-earth elements. In a preparation process of the primary dielectric material layer 21, it is desired to control a content of oxygen such that the primary dielectric material layer 21 contains a large amount of metal elements. The primary dielectric material layer 21 may include a hafnium zirconium oxide and contain a large amount of hafnium or zirconium element, which may be $Hf(Zr)_{1+x}O_2$, where x may range from 0.05 to 0.5, such as 0.125. In addition, a layer thickness of the primary dielectric material layer 21 may be in a range of 2 nm to 200 nm, in a range of 2 nm to 50 nm, or less than 10 nm. However, the present disclosure also applies to layer thicknesses other than the range described.

The primary dielectric material layer 21 may have a crystallization temperature. When a temperature is greater than or equal to such crystallization temperature, the primary dielectric material layer 21 undergoes a transition from an amorphous state to a crystalline state or a transition from one crystalline state to another crystalline state. The crystalline state includes a monoclinic crystal state, a tetragonal crystal state, a rhombohedral crystal state, an orthorhombic crystal state, or a cubic crystal state.

Initially, the primary dielectric material layer 21 may be provided as in an amorphous state. The crystallization temperature may be higher than 400° C., higher than 750° C., or higher than 1000° C. The primary dielectric material layer 21 may include a primary dielectric material layer 21 doped with a dopant. The doping may be performed in a separate process, such as by means of injection and diffusion. In addition, the dopant may be provided in situ along with remaining components of the dielectric material layer. The doping may be achieved by using an atomic layer deposition (ALD, MOALD) process with an appropriate precursor, a chemical vapor deposition (CVD, MOCVD) process, or a physical vapor deposition (PVD) process with an appropriate target material. The precursor may include transition metal oxide, transition metal, zirconium, hafnium, lead, titanium, silicon, barium, strontium, oxygen, nitrogen, aluminum, lanthanum, yttrium, erbium, calcium, magnesium, and/or rare-earth element. The target material may include transition metal oxide, transition metal, zirconium, zirconia, hafnium, hafnium oxide, lead, titanium, titanium oxide, silicon, silicon oxide, barium, strontium, oxygen, nitrogen, aluminum, alumina, lanthanum, yttrium, erbium, calcium, magnesium, and/or rare-earth element.

Figure 4C:
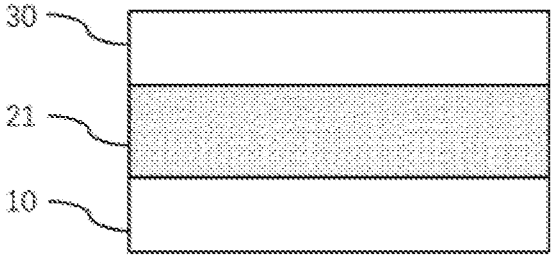

In another process, as shown in FIG. 4C, the cover layer 30 is provided on the primary dielectric material layer 21. The cover layer 30 may include a conductive region, a conductive material, or an electrode. The cover layer 30 may further include titanium nitride, tantalum nitride, tungsten nitride, niobium nitride, ruthenium oxide, carbon, tungsten, platinum, iridium or ruthenium. A thickness of the electrode may be in a range of 5 nm to 100 nm. The cover layer 30 may be provided at a first temperature, which is lower than the crystallization temperature of the primary dielectric material layer 21. The first temperature may be lower than 1000° C., lower than 750° C., or lower than 400° C.

Figure 4D:
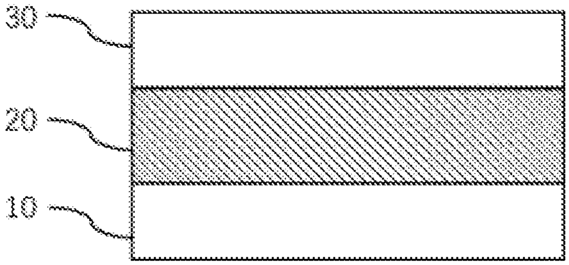

In another process, as shown in FIG. 4D, an arrangement of the dielectric material layer 20 and the cover layer 30 is heated to a second temperature, which is equal to or greater than the crystallization temperature. In this way, the primary dielectric material layer 21 is transformed into the dielectric material layer 20, where the dielectric material layer 20 includes a region in any of the aforementioned crystal states. The heating may be implemented as an annealing stage, which may include a standard annealing stage in a CMOS manufacturing process.

The dielectric constant of the dielectric material layer 20 may also be a function of a content of the dopant and a content of an excess metal element of the dielectric material layer 20. A selection on a composition of the dielectric material layer 20 may further result in desired crystallization. The crystalline state may be determined by selecting at least one appropriate dopant and its predetermined clearly defined content.

According to an embodiment, phase transitions of the dielectric material layer, the material thereof, or a partial region thereof is understood as a transition from the first state to the second state. The first and second states may include an amorphous state, an orthorhombic crystal state, a tetragonal crystal state, a rhombohedral crystal state, a cubic crystal state, a monoclinic crystal state, or any combination thereof. The term crystalline used herein includes monocrystalline and polycrystalline. According to an embodiment, the phase transition is inducted to reduce degradation, reduce formation of a conductive grain boundary, reduce a conductivity of a grain boundary, reduce a leakage current, and/or increase the dielectric constant of the dielectric material layer. Furthermore, according to an embodiment, a concentration of the dopant and a concentration of the excess metal element may be adjusted to obtain physical and dielectric properties as desired.

According to one embodiment, the dielectric material layer 20 may further include a region or domain in a ferroelectric polarization state or an antiferroelectric state. In this case, the crystalline state may be one or more of the crystalline states described in the aforementioned embodiments. In addition, the entire dielectric material layer 20 may be ferroelectric or antiferroelectric.

In this way, the dielectric material layer 20 may use electric polarization to provide an information state of the entity of the memory, such as a binary state “O” or “1”, which may be stored in the dielectric material layer 20 through two distinguishable ferroelectric polarization states. Electric polarization between levels of two saturated ferroelectric polarization states may provide storage of several information cells (such as a two-bit memory cell or a three-bit memory cell). The latter may also be referred to as a multi-bit memory cell.

A polarization orientation of the dielectric material layer 20 in the ferroelectric polarization state may be defined relative to an interface between the dielectric material layer 20 and a substrate, an electrode, or a cover layer (such as an interface between the dielectric material layer 20 and the substrate 10 or the cover layer 30), for example, the polarization orientation may be upwards perpendicular to the interface or downwards perpendicular to the interface.

According to the embodiments of the present disclosure, the dielectric material layer further includes an antiferroelectric state. When the dielectric material layer is in the antiferroelectric state as a whole or in part, adjacent dipole moments in the dielectric material layer are oriented opposite to each other, so that the overall polarization of the dielectric material layer tends to disappear.

Figure 5A:
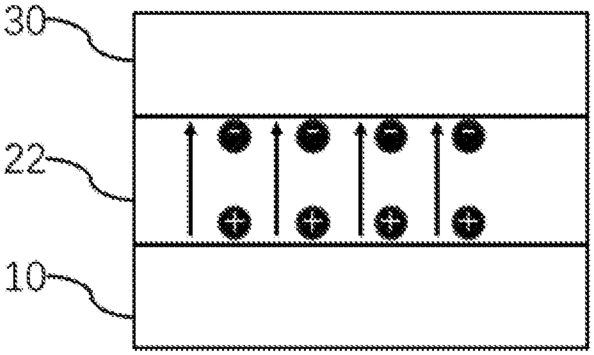
FIGS. 5A to 5C show schematic diagrams of a dielectric material layer in various ferroelectric states according to an embodiment of the present disclosure.
Figure 5B:
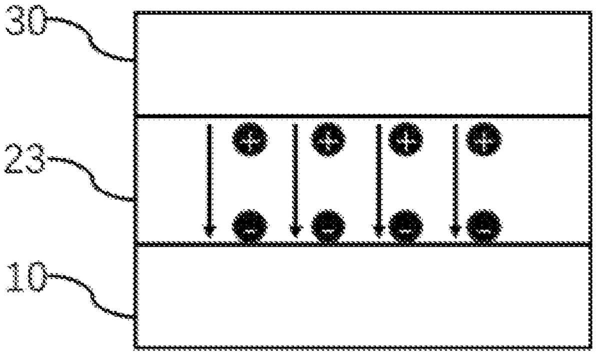
Figure 5C:
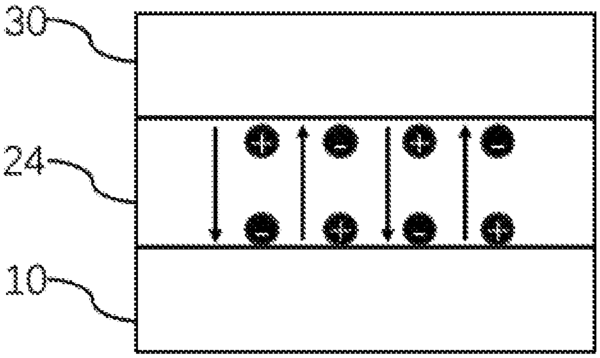

In the embodiments of the present disclosure, FIGS. 5A to 5C show schematic diagrams of a dielectric material layer in various ferroelectric states according to an embodiment of the present disclosure. As shown in FIG. 5A, the dielectric material layer 22 is disposed on the substrate 10. The cover layer 30 is disposed on the dielectric material layer 22. The dielectric material layer 22 is in the ferroelectric state (also known as the ferroelectric polarization state), so that the dipole moments inside the dielectric material layer 22 are oriented perpendicular to the interface between the dielectric material layer 22 and the substrate 10 or perpendicular to the interface between the oxide layer 22 and the cover layer 30. In addition, the orientation of the dipole moment points towards the cover layer 30.

As shown in FIG. 5B, a dielectric material layer 23 is disposed on the substrate 10. Compared to the dielectric material layer 22 shown in FIG. 5A, an orientation of the electric dipoles in the dielectric material layer 23 is opposite and parallel to the orientation of the electric dipoles in the dielectric material layer 22. Physically, the dielectric material layers 22, 23, and 24 are identical layers, distinguished only by the orientations of the electric dipoles. The orientations of the electric dipoles may then be switched and changed, and such switching may be achieved by applying a voltage between the substrate 10 or its conductive entity (such as an electrode) and the cover layer 30. Such voltage may range from 0.5 V to 5 V. The thickness of the dielectric material layer may be considered to determine an appropriate switching voltage threshold. In addition, two ferroelectric states, such as the ferroelectric state of the dielectric material layer 22 and the ferroelectric state of the dielectric material layer 23, may be distinguished by an offset of a threshold voltage. Such offset may be within a range of 50 mV to 1.5 V. The thickness of each of the dielectric material layers 22, 23 and 24 may be in a range of 1 nm to 70 nm, or approximately 10 nm.

As shown in FIG. 5C, the dielectric material layer 23 is disposed between the substrate 10 and the cover layer 30. The dipole moments of the dielectric material layer 24 are arranged so that adjacent dipole moments are oriented opposite to each other. In this way, the adjacent dipole moments cancel each other out, so that the overall polarization of the dielectric material layer 24 substantially disappears. Such state may be referred to as an antiferroelectric state of the dielectric material layer 24. An antiferroelectric material has dipole moments at a microscopic scale, a microcrystalline scale, or a domain scale, so that the antiferroelectric material may still be distinguished from a non-ferroelectric material. The antiferroelectric material is still a kind of ferroelectric material, so the state of the antiferroelectric material may be switched to a ferroelectric state, such as to a state of the dielectric material layer 22 or the dielectric material layer 23.

Figure 6:
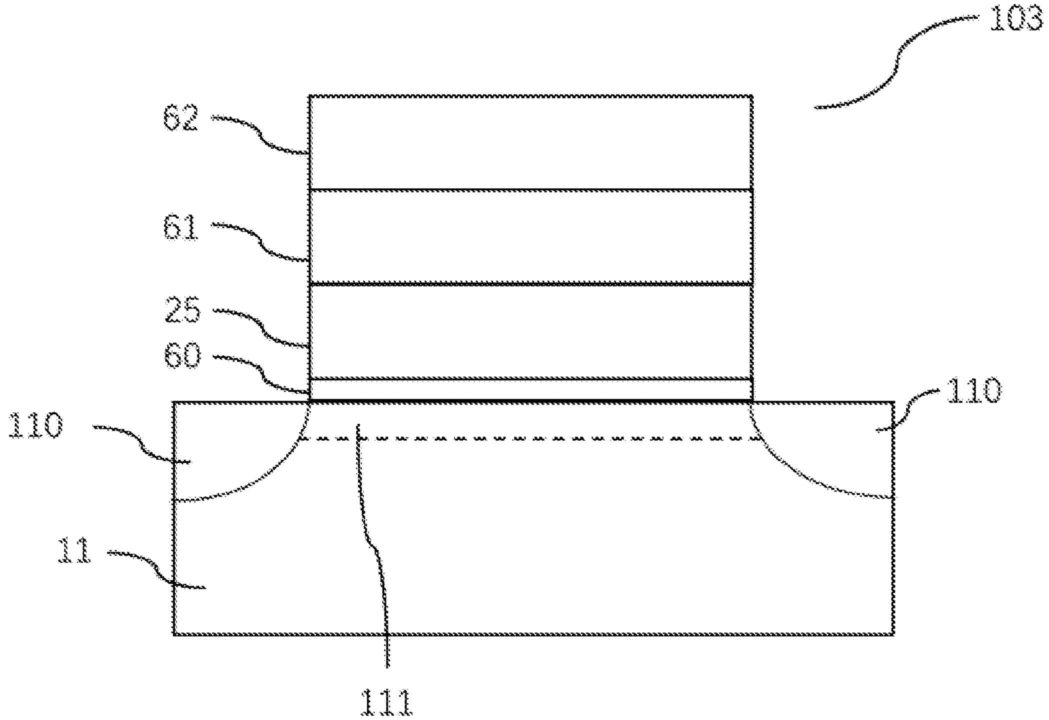
FIG. 6 shows a schematic diagram of a specific structure of a transistor based on a dielectric material containing a metal interstitial impurity according to an embodiment of the present disclosure.

FIG. 6 shows a schematic diagram of a specific structure of a transistor based on a dielectric material containing a metal interstitial impurity according to an embodiment of the present disclosure. A transistor 103 is disposed on the substrate 11. The substrate 11 includes a doped region 110 and a transistor channel 111, similar to those illustrated in FIG. 2A. A first intermediate layer 60 is disposed on the substrate 11. A ferroelectric layer 25 is disposed on the first intermediate layer 60, where the ferroelectric layer is made of a dielectric material. A second intermediate layer 61 is further disposed on the ferroelectric layer 25. A top layer 62 is disposed on the second intermediate layer 61. Finally, a transistor based on the dielectric material containing the metal interstitial impurity is obtained.

The first intermediate layer 60 includes a buffer layer and/or an insulation layer, including silicon oxide or one of the insulation materials commonly known in the manufacturing of high-density integrated devices. The second intermediate layer 61 is a metal gate, including a conductive material such as titanium nitride, tantalum nitride, tungsten, an intermediate bandgap material, or the like.

The ferroelectric layer 25 includes a domain in a ferroelectric state, similar to an action of a hole or electron captured by a charge. In addition, the state of the oxide layer 25 may be switched between different ferroelectric states. In this way, the dielectric material layer 25 may exhibit different dipole moments, so that the conductivity of the transistor channel 111 may be affected. In this way, stability and permanent dipoles of the dielectric material layer 25 may determine the conductivity of the channel 111, so as to provide storage for the information state. The stored information state may be determined by measuring a current through the transistor channel 111.

A thickness of the intermediate layer 60 may be in a range of 0.1 nm to 5 nm. The intermediate layer 60 includes an insulation material, such as silicon dioxide. A thickness of the ferroelectric layer 25 may be in a range of 2 nm to 50 nm. The ferroelectric layer may include hafnium oxide, zirconia, doped hafnium oxide, doped zirconia, doped hafnium zirconia oxide, hafnium oxide doped with a rare-earth element, hafnium oxide doped with a rare-earth element, or any material from the aforementioned possible materials of the dielectric material layer 20, which contains a large amount of metal element(s). Such material contains a large amount of metal element(s) and contains an interstitial impurity in annealed crystalline grains.

According to an embodiment, the transistor based on the dielectric material containing the metal interstitial impurity has two distinguishable ferroelectric states, including the first ferroelectric state and the second ferroelectric state, which may be applied to the ferroelectric layer 25 to provide a memory entity or a memory cell. Switching may be achieved by applying a voltage pulse to the second intermediate layer 61, and in this case the second intermediate layer 61 may serve as a gate electrode. Amplitude of the voltage pulse may be in a range of 0.5 V to 7 V, or approximately 1.5 V or 3 V. The polarization state of the ferroelectric dipoles in the ferroelectric layer 25 may provide a voltage offset, which may in turn affect the conductivity of the transistor channel 111.

According to another embodiment, a silicon dioxide ($SiO_2$) layer with a thickness of 0.2 nm to 3 nm is grown on the substrate. The silicon dioxide layer may be either the first intermediate layer 60 or part of the first intermediate layer 60. A hafnium zirconium oxide layer is deposited on the silicon dioxide layer, where the hafnium zirconium oxide layer contains a large amount of hafnium element and/or zirconium element. Any material of the dielectric material layers 22, 23, 24 and 25 described above may also be used. A deposition of a metal electrode may be performed on the hafnium zirconium oxide layer, including a deposition of tantalum nitride, titanium nitride, tungsten, platinum, tantalum nitride carbon (TaCN), or niobium nitride carbon. The metal electrode may be the second intermediate layer 61 and/or the top layer 62, or may be part of the second intermediate layer 61 and/or the top layer 62. Then, a high-temperature annealing may be performed, at a temperature above 400° C., by using plasma nitriding or in an atmosphere of nitrogen/ammonia, so as to crystallize the hafnium zirconium oxide layer or induce a phase transition of the hafnium zirconium oxide layer to any of the aforementioned crystalline states.

The foregoing only describes exemplary embodiments of the present disclosure. Therefore, the disclosed features, claims, and drawings are necessary for implementing the present disclosure individually and in any combination in various embodiments of the present disclosure. Although the aforementioned content is specific to the present disclosure, other and further embodiments of the present disclosure may be designed without departing from the basic scope of the present disclosure, and the scope of the present disclosure is determined by the claims attached.

A detailed description of the embodiments of the present disclosure has been provided in conjunction with the accompanying drawings. It should be noted that implementation methods not shown or described in the accompanying drawings or the text of the specification are all in forms known to those of ordinary skill in the art, which are not explained in detail. In addition, the above definitions of the various elements and methods are not limited to the various specific structures, shapes, or methods mentioned in the embodiments, which may be easily modified or replaced by those of ordinary skill in the art.

Based on the above descriptions, those skilled in the art may have a clear understanding of the semiconductor device based on the dielectric material containing the metal interstitial impurity in the present disclosure.

In view of above, the present disclosure provides a semiconductor device based on a dielectric material containing a metal interstitial impurity, involving a novel dielectric material that provides materials with specific advantages for manufacturing various semiconductor devices and integrated circuits. The dielectric material layer is in a crystalline state and the presence of interstitial impurity in the lattice generates stress, inducing the ferroelectric property in the dielectric material layer, thereby achieving different functional devices on this basis.

It may be seen from the above technical solutions that the semiconductor device based on a dielectric material containing a metal interstitial impurity in the present disclosure has at least one or part of the following beneficial effects:

(1) an adjustable coercive electric field;

(2) low power consumption and high reliability;

(3) a simple structure, which is suitable for large-scale integration; and (4) low preparation costs.

It should also be noted that the above are different embodiments provided in the present disclosure. These embodiments are intended to illustrate the technical content of the present disclosure, rather than to limit a scope of the claims of the present disclosure. A feature in one embodiment may be applied to another embodiment through appropriate modifications, replacements, combinations, and separations.

It should be noted that in the present disclosure, unless otherwise specified, having "an" element is not limited to having a single element, but may have one or more such elements.

In addition, in the present disclosure, unless otherwise specified, ordinal numbers such as "first" and "second" are only used to distinguish multiple elements with the same name, and do not imply the existence of rank, hierarchy, execution order, or process order between them. A "first" element and a "second" element may appear together in the same component or separately in different components. The presence of an element with a larger ordinal number does not necessarily indicate the presence of another element with a smaller ordinal number.

In the present disclosure, unless otherwise specified, the so-called feature A "or" or "and/or" feature B refers to the presence of A alone, B alone, or both A and B; the so-called feature A "and" feature B refers to the coexistence of A and B; the so-called "including", "comprising", "having", and "containing" refer to including but not limited to this.

In addition, in the present disclosure, the terms "up", "down", "left", "right", "front", "back", or "between" are only used to describe the relative positions between multiple elements, and may be extended to include translation, rotation, or mirroring in interpretation. In addition, in the present disclosure, unless otherwise specified, "an element on a further element" or similar statements do not necessarily indicate that the element is in contact with the further element.

In addition, unless otherwise described or required to be performed sequentially, the order of the above steps is not limited to the ones listed above and may be changed or rearranged as desired. The above embodiments may be used in combination with each other or with other embodiments based on design and reliability considerations, that is, the technical features in different embodiments may be freely combined to form more embodiments.

The specific embodiments described above further explain the objectives, technical solutions and advantages of the present disclosure. It should be understood that the above are only specific embodiments of the present disclosure and are not intended to limit the present disclosure. Any modifications, equivalent substitutions, improvements, etc. made within the spirit and principles of the present disclosure should be included in the protection scope of the present disclosure.

What is claimed is:

1. A semiconductor device based on a dielectric material containing a metal interstitial impurity, comprising:

a substrate, a dielectric material layer, and a functional layer;

wherein a material for preparing the dielectric material layer is a compound containing the metal interstitial impurity;

wherein the dielectric material layer and/or the functional layer is configured to subject to at least one of electricity, heat, light or magnetism, such that the dielectric material layer reaches a crystallization temperature to transit from a first state to a second state; and wherein the metal interstitial impurity is in a lattice interstice of the dielectric material in a crystalline state.

2. The semiconductor device based on the dielectric material containing the metal interstitial impurity according to claim 1, wherein a chemical formula of the compound containing the metal interstitial impurity is:

$$X_aY_{1-a}Z_bW,$$

wherein X is a first element, Y is a doped impurity element, Z is an interstitial impurity element, W is a second element, a is a content of the first element, (1−a) is a content of the doped impurity element, wherein 0≤a≤1; and b is a content of the interstitial impurity element, wherein 0.05≤b≤0.5.

3. The semiconductor device based on the dielectric material containing the metal interstitial impurity according to claim 2, wherein the first element is selected from transition metal element, hafnium, zirconium, silicon, aluminum, titanium, tantalum, barium, strontium, lanthanum, yttrium, erbium, calcium, magnesium, and rare-earth element;

the second element is selected from nitrogen, oxygen, and titanium acid;

the doped impurity element is selected from one or more of transition metal element, hafnium, zirconium, silicon, aluminum, titanium, tantalum, barium, strontium, lanthanum, yttrium, erbium, calcium, magnesium, and rare-earth element; and the interstitial impurity element is selected from one or more of transition metal element, hafnium, zirconium, silicon, aluminum, titanium, tantalum, barium, strontium, lanthanum, yttrium, erbium, calcium, magnesium, and rare-earth element.

4. The semiconductor device based on the dielectric material containing the metal interstitial impurity according to claim 3, wherein the dielectric material layer comprises hafnium zirconium oxide compound, and the first element and/or the doped impurity element and/or the interstitial impurity element are selected from hafnium and zirconium; and wherein the second element is oxygen.

5. The semiconductor device based on the dielectric material containing the metal interstitial impurity according to claim 1, wherein the first state comprises an amorphous state, and the second state comprises a crystalline state; the crystalline state comprises a monoclinic crystal state, a tetragonal crystal state, a rhombohedral crystal state, an orthorhombie crystal state, or a cubic crystal state, wherein the dielectric material layer in the crystalline state contains the metal interstitial impurity in a lattice interstice.

6. The semiconductor device based on the dielectric material containing the metal interstitial impurity according to claim 5, wherein the metal interstitial impurity in the lattice interstice of the dielectric material layer in the crystalline state causes lattice expansion and lattice deformation, so as to generate a tensile stress and/or a compressive stress, and the dielectric material layer has a ferroelectric domain.

7. The semiconductor device based on the dielectric material containing the metal interstitial impurity according to claim 1, wherein the first state comprises a first crystalline state, and the second state comprises a second crystalline state.

8. The semiconductor device based on the dielectric material containing the metal interstitial impurity according to claim 7, wherein the first crystalline state and/or the second crystalline state comprises a region or a domain in a monoclinic crystal state, a tetragonal crystal state, a rhombohedral crystal state, an orthorhombic crystal state, or a cubic crystal state.

9. The semiconductor device based on the dielectric material containing the metal interstitial impurity according to claim 1, wherein when the dielectric material layer is in a ferroelectric polarization state as a whole or in part, a polarization orientation of the dielectric material layer points towards an interface between the dielectric material layer and the functional layer or an interface between the dielectric material layer and the substrate, and the polarization orientation is reversed by using at least one of electricity, heat, light, force or magnetism, such that the dielectric material layer is switched between different ferroelectric states.

10. The semiconductor device based on the dielectric material containing the metal interstitial impurity according to claim 1, wherein the dielectric material layer further comprises an antiferroelectric state, and when the dielectric material layer is in the antiferroelectric state as a whole or in part, adjacent dipole moments in the dielectric material layer are oriented opposite to each other, such that an overall polarization of the dielectric material layer tends to disappear.

11. The semiconductor device based on the dielectric material containing the metal interstitial impurity according to claim 1, wherein the functional layer comprises an electrode and a channel layer, so as to achieve a function of a device comprising at least one of a transistor, a capacitor, a resistor, a conductor laser, or an optical sensor.

* * * * *